(12) United States Patent
Kadowaki et al.

(10) Patent No.: US 10,833,666 B1
(45) Date of Patent: Nov. 10, 2020

(54) PWM CONTROLLED ANALOG SIGNAL

(71) Applicant: Dialog Semiconductor (UK) Limited, London (GB)

(72) Inventors: Keisuke Kadowaki, Tokyo (JP); Naoyuki Unno, Kanagawa (JP); Hiromitsu Aoyama, Kanagawa (JP)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/573,054

(22) Filed: Sep. 17, 2019

(51) Int. Cl.
*H03K 3/017* (2006.01)
*H03K 5/04* (2006.01)
*H03K 7/08* (2006.01)
*H04B 1/16* (2006.01)

(52) U.S. Cl.
CPC ............... *H03K 7/08* (2013.01); *H04B 1/16* (2013.01)

(58) Field of Classification Search
CPC ............ H03K 7/08; H03K 3/284; H03K 5/04; H03K 5/1565; H03K 5/13
USPC .................................. 327/172–175, 551–559
See application file for complete search history.

(56) References Cited

U.S. PATENT DOCUMENTS

| | | | |
|---|---|---|---|
| 6,038,265 A | 3/2000 | Pan et al. | |
| 6,362,766 B1 | 3/2002 | Rowan et al. | |
| 6,462,692 B1 | 10/2002 | Moriya | |
| 9,621,138 B1* | 4/2017 | Zhang | H03K 3/353 |
| 2001/0048281 A1* | 12/2001 | Aoki | H02P 7/2805 |
| | | | 318/470 |
| 2004/0178349 A1* | 9/2004 | Kameshima | G01T 1/2018 |
| | | | 250/370.11 |
| 2007/0216489 A1* | 9/2007 | Krishnan | H03L 7/093 |
| | | | 331/16 |
| 2011/0012652 A1* | 1/2011 | Lamanna | H03L 7/0893 |
| | | | 327/156 |
| 2012/0114033 A1 | 5/2012 | Chen | |
| 2015/0244385 A1* | 8/2015 | Alladi | H03M 1/0629 |
| | | | 341/122 |
| 2017/0085251 A1* | 3/2017 | Lin | H03F 3/45475 |

FOREIGN PATENT DOCUMENTS

DE  102005047031 A1  4/2007

OTHER PUBLICATIONS

Microchip Data Sheet AN538, "Using PWM to Generate Analog Output," by Amar Palacheria, © 1997 Microchip Technology Inc., 4 pages.
Texas Instruments, Using PWM Output as a Digital-to-Analog Converter on a TMS320F280x Digital Signal Controller, Application Report SPRAA88A—Sep. 2008, pp. 1-31.
German Office Action, File No. 10 2019 218 596.7, Applicant: Dialog Semiconductor (UK) Limited, dated Aug. 21, 2020, 6 pages.

* cited by examiner

*Primary Examiner* — Anh Q Tra
(74) *Attorney, Agent, or Firm* — Saile Ackerman LLC; Stephen B. Ackerman (57) ABSTRACT

A voltage proportional to a pulse width modulation (PWM) duty cycle is generated, using a low pass filter (LPF). A 2nd or higher order LPF is provided, giving a 90×(2n+1) degree phase shift for (n=0, 1, 2, . . . ), so that the sampling timing at the latter stages can be at the rising and/or falling edge of the PWM input signal. A switched capacitor circuit after the 2nd or higher order LPF is provided, removing a voltage ripple on an LPF output, and using a smaller device area.

20 Claims, 12 Drawing Sheets

PWM CONTROLLED ANALOG SIGNAL

FIELD

The present disclosure relates generally to passing voltage level information through a digital interface.

BACKGROUND

A pulse width modulation signal is often used to pass voltage level information through a digital interface. The duty cycle of the PWM signal represents the voltage level, and is translated into an analog signal, using a low pass filter (LPF). The cut off frequency of the LPF needs to be sufficiently lower than the frequency of the PWM signal, because of the voltage ripple created by a −20 dB/dec attenuation characteristic of the LPF. To improve the attenuation, multiple LPFs may be cascaded. Generally, an LPF with very low cut off frequency occupies a large area on the chip, for the chosen resistor and capacitor values, because the cut off frequency is inversely proportional to the RC product of the low pass filter.

SUMMARY

Accordingly, it is an object of one or more embodiments of the present disclosure to generate a voltage proportional to a pulse width modulation (PWM) duty cycle, using a low pass filter (LPF).

It is a further object of one or more embodiments of the disclosure to remove a voltage ripple on an LPF output, using a smaller device area.

Still further, it is an object of one or more embodiments of the disclosure to provide a 2nd or higher order LPF, with a 90×(2n+1) degree phase shift, with the sampling timing of the latter stages at the rising and/or falling edge of the PWM signal.

Still further, it is an object of one or more embodiments of the disclosure to provide a switched capacitor circuit, to remove any remaining voltage ripple after a 2nd or higher order LPF, without fine-tuning its timing generator.

Other objects will appear hereinafter.

The above and other objects of the present disclosure may be accomplished in the following manner. A circuit for generating a pulse width modulation (PWM) controlled analog signal is provided, comprising a buffer, configured to receive a PWM input signal, and a low pass filter (LPF), connected to a buffer output, configured to remove a voltage ripple on an LPF output, the LPF comprising a 2nd or higher order LPF. The circuit also comprises a first switched capacitor (SC) circuit, connected to the LPF output, configured to remove a remaining voltage ripple, and to output the PWM controlled analog signal.

The above and other objects of the present disclosure may be further accomplished with a method for generating a pulse width modulation (PWM) controlled analog signal. The steps include generating a voltage proportional to a duty cycle of a pulse width modulation (PWM) input signal, using a low pass filter (LPF), where the LPF is a $2^{nd}$ or higher order LPF. The steps include sampling an output of the LPF at a falling and/or rising edge of the PWM input signal. The steps also include removing a voltage ripple on the output of the LPF, using a first switched capacitor circuit.

In various embodiments the pulse width modulation (PWM) controlled analog signal may be constructed with a buffer amplifier between the low pass filter, (LPF) and the switched capacitor (SC) circuit.

In various embodiments the pulse width modulation analog signal may be generated with an active sample and hold (SAH) circuit built around an amplifier, so that the generated output voltage is relatively low-impedance in nature.

BRIEF DESCRIPTION OF THE DRAWINGS

The present disclosure will be more clearly understood from the following description taken in conjunction with the accompanying drawings in which like reference numerals designate similar or corresponding elements, regions and portions and in which.

DETAILED DESCRIPTION

The present disclosure proposes to generate a voltage proportional to a pulse width modulation (PWM) duty cycle, using a low pass filter (LPF), removing the voltage ripple on the LPF output, using a smaller device area than that of the prior art. A 2nd or higher order LPF gives a 90×(2n+1) degree phase shift, so that the sampling timing at a latter stage can be at the rising and/or falling edge of the PWM input signal (n=0, 1, 2 . . . ). A switched capacitor circuit is used to remove any remaining voltage ripple after the 2nd or higher order LPF, without fine-tuning its timing generator.

The table below shows the output ripple level if a 70 kHz 50% duty cycle square waveform is applied to a cascaded resistor-capacitor (RC) LPF, where the low pass RC filter consists of a resistance of 4.08 Mohm and a capacitance of 1.4 pF. Here, the cut-off frequency of the LPF is 28 kHz, and as the order of the RC filter increases, the voltage ripple level on the output decreases. The top 4 rows are for prior art systems, versus the disclosed circuit in the last row, using a single LPF $1^{st}$-$4^{th}$ order RC filter.

| Order of RC filter (Number of cascaded RC filters) | Applied square wave amplitude on LPF input(V) | Ripple level on output (mV) |
|---|---|---|
| 1 | 1.5 | 807 |
| 2 | 1.5 | 200 |

-continued

| Order of RC filter (Number of cascaded RC filters) | Applied square wave amplitude on LPF input(V) | Ripple level on output (mV) |
|---|---|---|
| 3 | 1.5 | 53 |
| 4 | 1.5 | 15 |
| The disclosure (example) | 1.5 | 2 |

Figure 1:
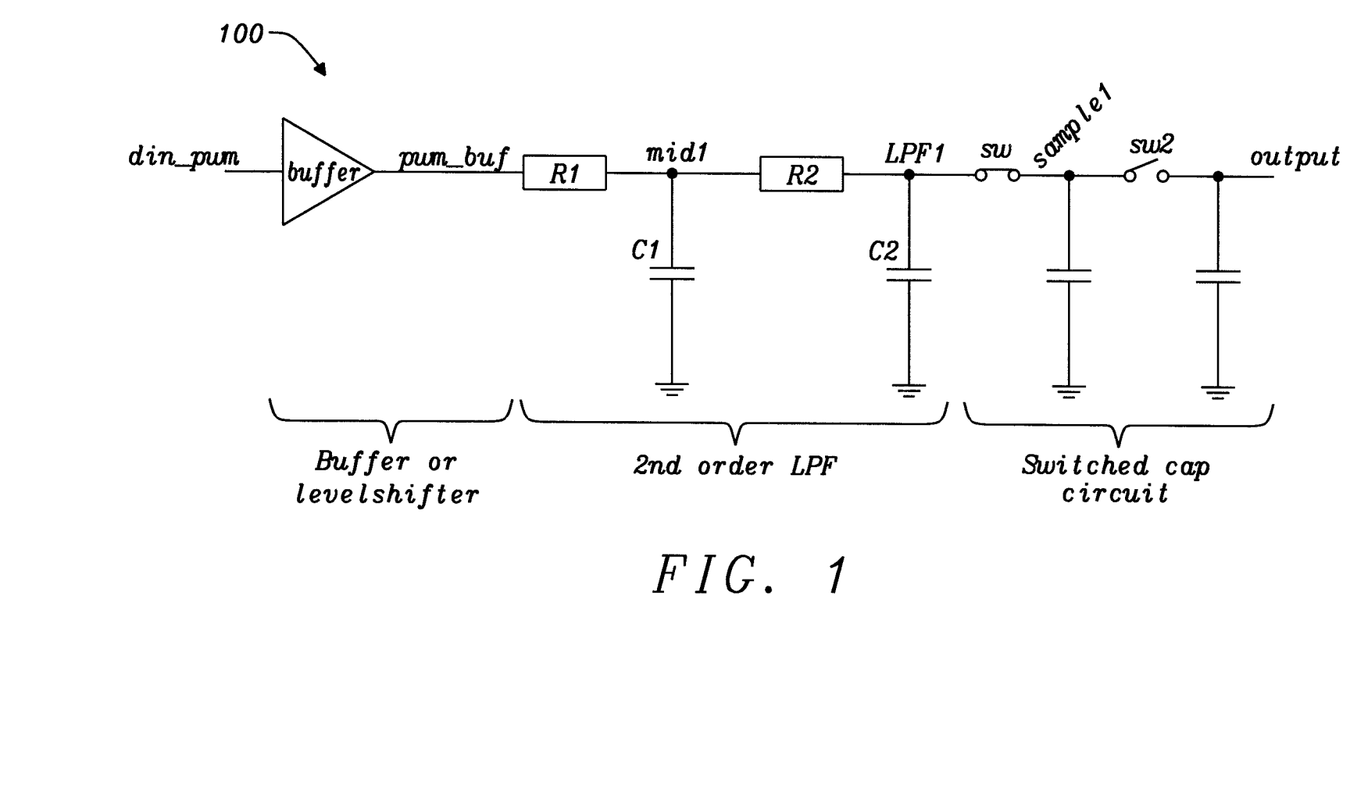
FIG. 1 shows a simplified schematic circuit of the present disclosure.
Figure 2:
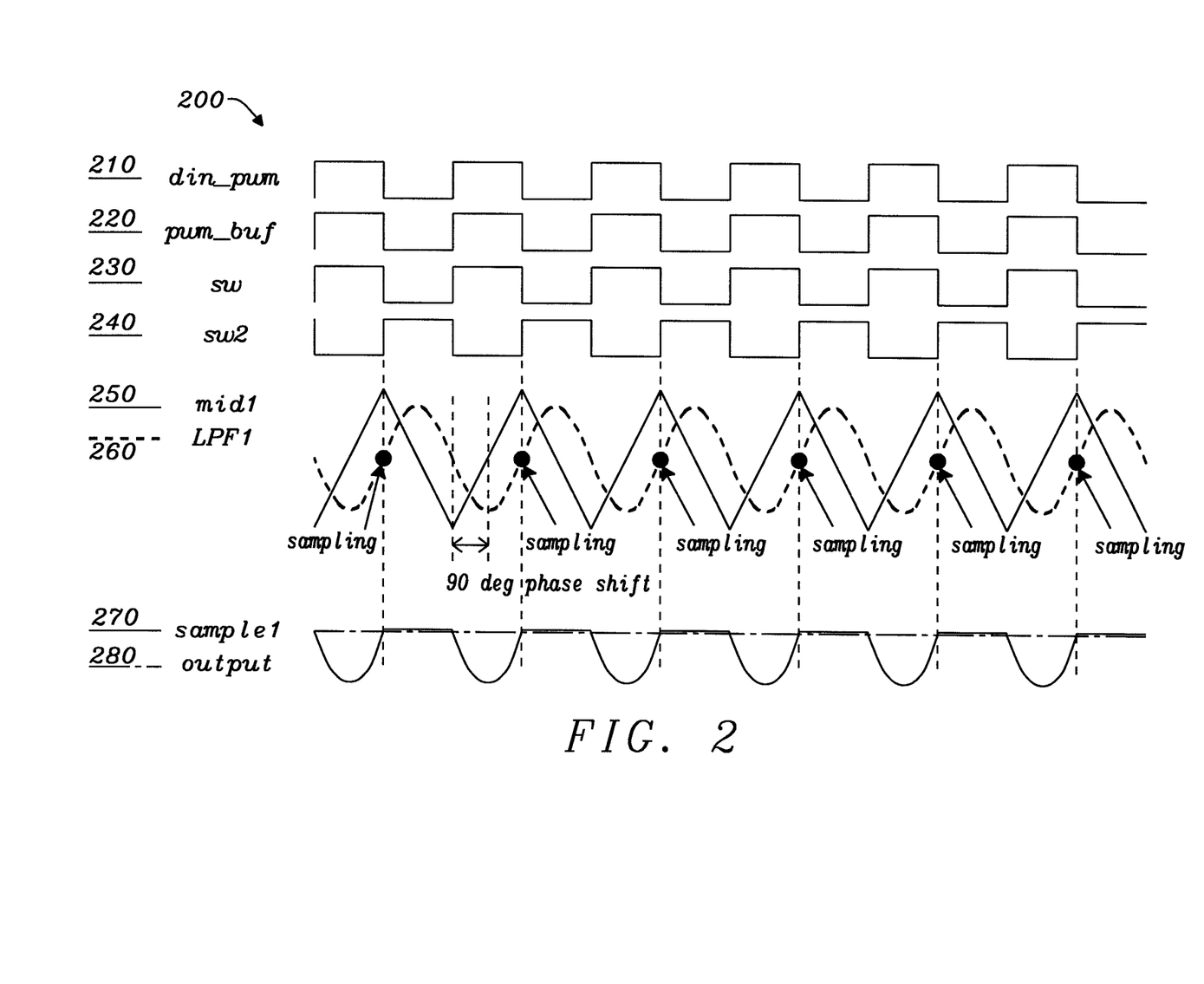
FIG. 2 shows a timing diagram of the schematic illustrated in FIG. 1.

FIG. 1 shows 100, a simplified schematic of the present disclosure, and is more fully described with reference to FIG. 2 below. The circuit consists of a buffer, a 2nd order low pass filter (LPF), and a switched capacitor circuit. A higher order LPF can also be used instead of a 2nd order LPF. The sampling operation occurs at the falling edge of the given PWM signal, as illustrated in FIG. 2. When the PWM signal falls, the output voltage is the average value of itself, due to a phase shift of the 2nd order LPF. Similarly, when the PWM signal rises, the output voltage of the 2nd order LPF is the average value of itself, as illustrated in FIG. 4.

FIG. 2 shows 200, a timing diagram of the schematic illustrated in FIG. 1. Signal din_pwm 210 represents the input to the buffer, and signal pwm_buf 220 the output of the buffer. Node mid1 250 represents the voltage at a first RC filter, at the point where R1 connects to capacitance C1. Node LPF1 260 represents the output voltage of the 2nd order LPF, at the point where R2 connects to capacitance C2. Switch sw 230 is connected between LPF1 and switch sw2 240 at a sampling point sample1 270, and sw2 240 is connected between sample1 and output 280. The sampling operation occurs at the falling edge of din_pwm in FIG. 2, when switch sw opens and sw2 closes. Mid1 is at its maximum, and LPF1 is at its midpoint or average value, due to the 90-degree phase shift of the 2nd order LPF. Similarly, node LPF1 is around its average value when the PWM signal rises, in FIG. 4.

Figure 3:
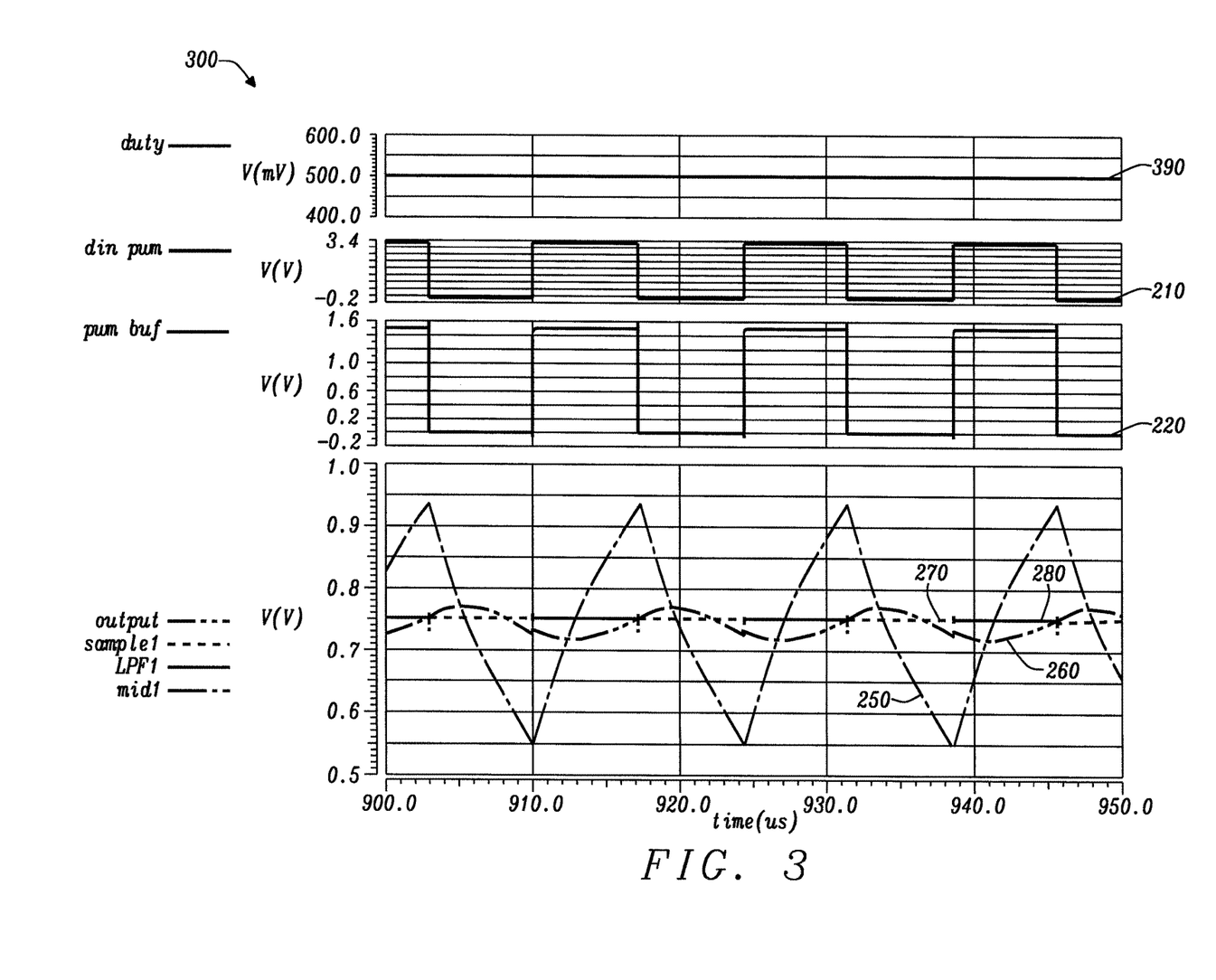
FIG. 3 shows simulation results for the circuit in FIG. 1.

FIG. 3 shows 300, simulation results for the circuit in FIG. 1. The duty cycle is represented by signal 390, and signals din_pwm 210, pwm_buf 220, mid1 250, LPF1 260, sample1 270, and output 280 are as described in FIG. 2. The sampling operation occurs at the falling edge of din_pwm, for the duration of din_pwm low. Note that LPF1 and sample1 coincide when din_pwm is high. FIG. 3 confirms that the voltage ripple on the output signal is removed, using the switched capacitor circuit of FIG. 1. Note that the order of the LPF may be $2^{nd}$ or higher order, for the circuit of the disclosure. Also note that the PWM input is shown in FIG. 2 and later figures as having a 50% duty cycle, but the disclosure operates in the same manner with other duty cycles.

Figure 4:
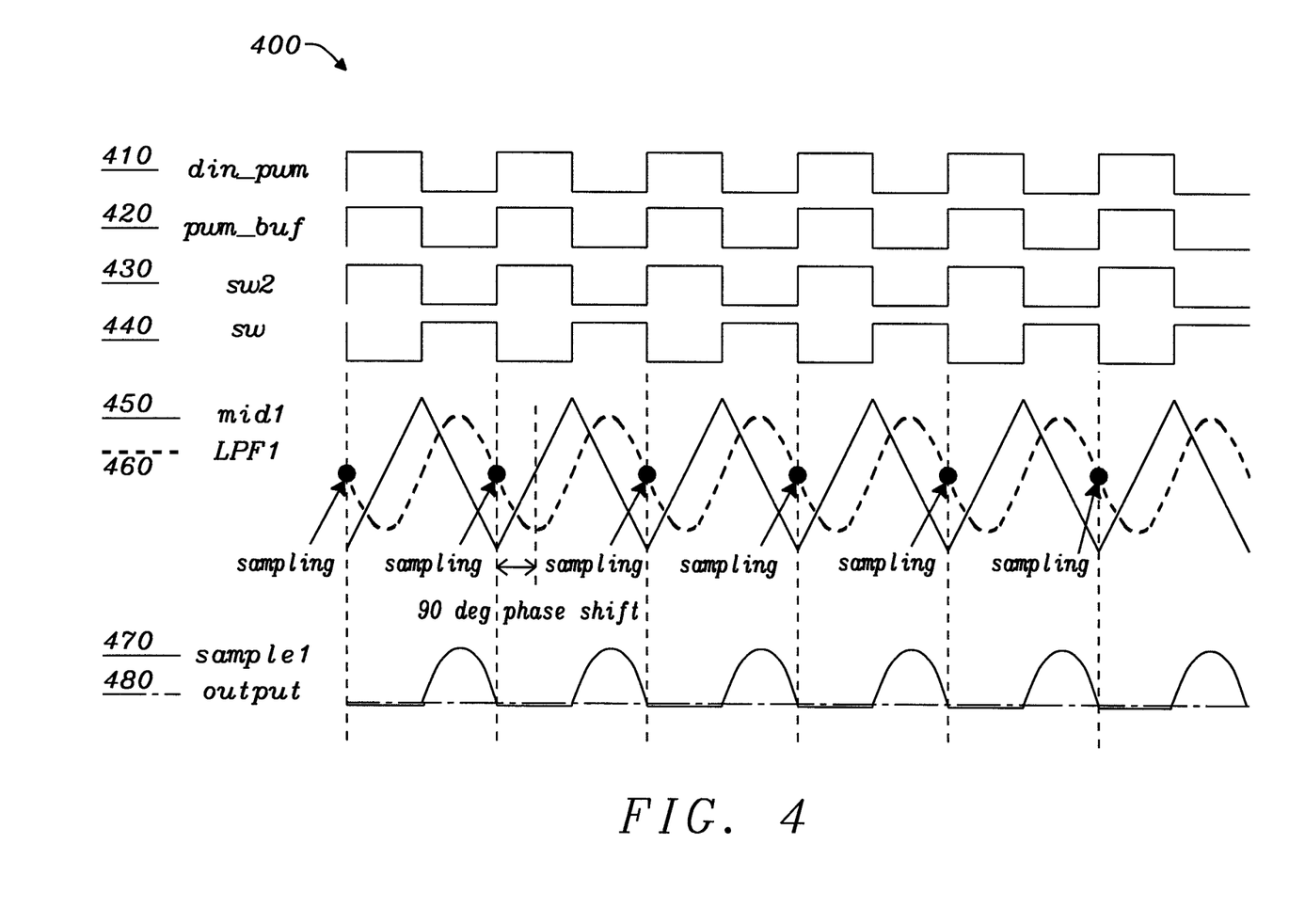
FIG. 4 shows a timing diagram for an alternative control method of the schematic illustrated in FIG. 1, giving the same results.

FIG. 4 shows 400, a timing diagram for an alternative control method of the schematic illustrated in FIG. 1, giving the same results. Signal din_pwm 410 represents the input to the buffer, and signal pwm_buf 420 the output of the buffer. Node mid1 450 represents the voltage at a first RC filter, at the point where R1 connects to capacitance C1. Node LPF1 460 represents the output voltage of the 2nd order LPF, at the point where R2 connects to capacitance C2. Switch sw 440 is connected between LPF1 and switch sw2 430 at a sampling point sample1 470, and sw2 430 is connected between sample1 and output 480. The sampling operation occurs at the rising edge of din_pwm in FIG. 4, when switch sw opens and sw2 closes.

Mid1 is at its midpoint, and LPF1 is at its average value, due to the 90-degree phase shift of the 2nd order LPF. If the cut off frequency is too high to make the 90-degree shift as shown in FIG. 2 and FIG. 4, the circuit of the present disclosure may be modified, as in FIG. 5.

Figure 5:
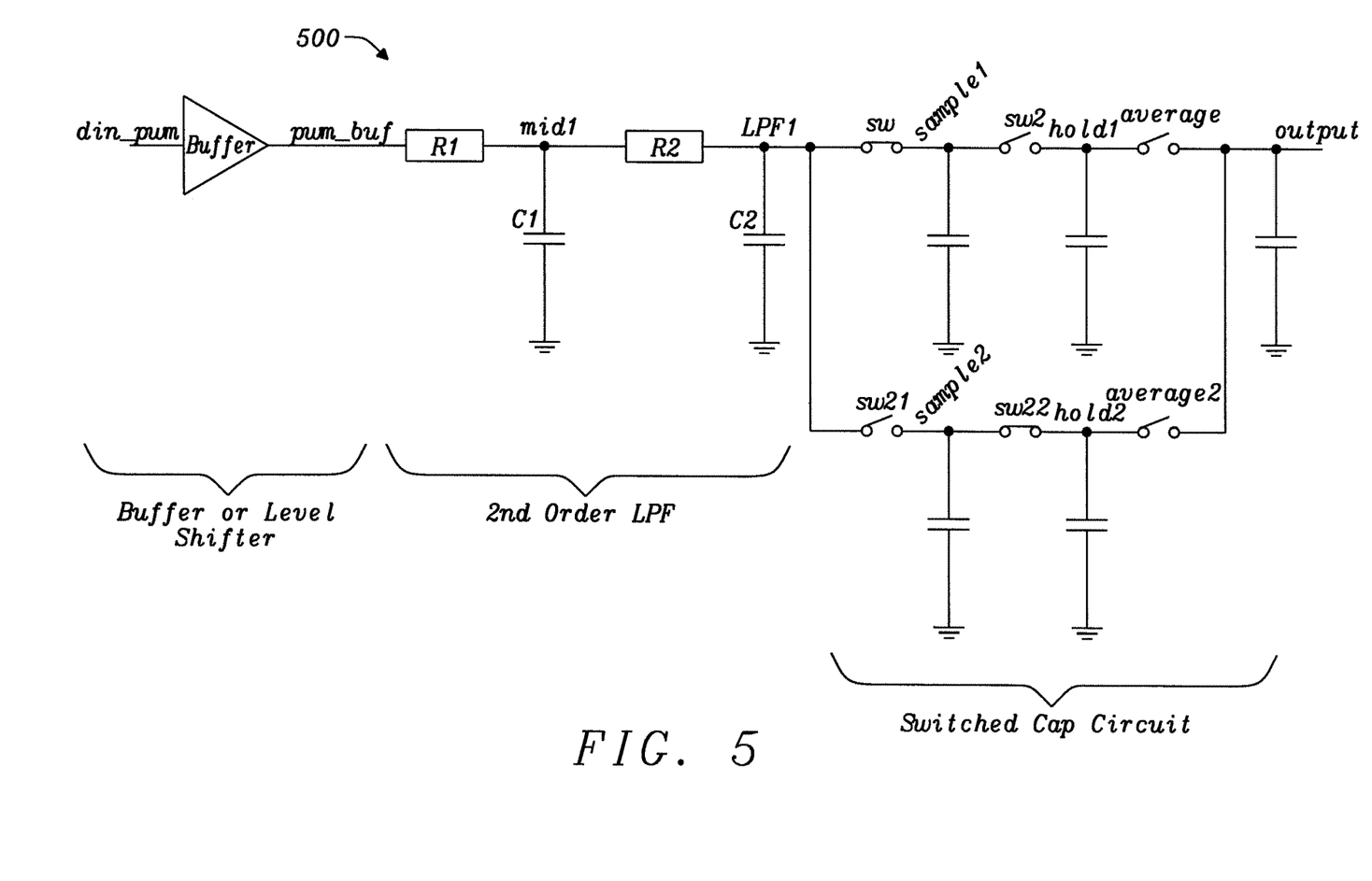
FIG. 5 shows a modified schematic of FIG. 1, for the present disclosure.

FIG. 5 shows 500, a modified schematic of FIG. 1. This circuit has two sampling paths, sample1 and sample2, to average the output voltage from, for a given sampling operation. The circuit consists of a buffer, a 2nd order low pass filter (LPF), and two switched capacitor circuits connected in parallel with one another. The sampling operation may occur at both the rising and falling edges of the PWM signal, as shown in FIG. 6.

Figure 6:
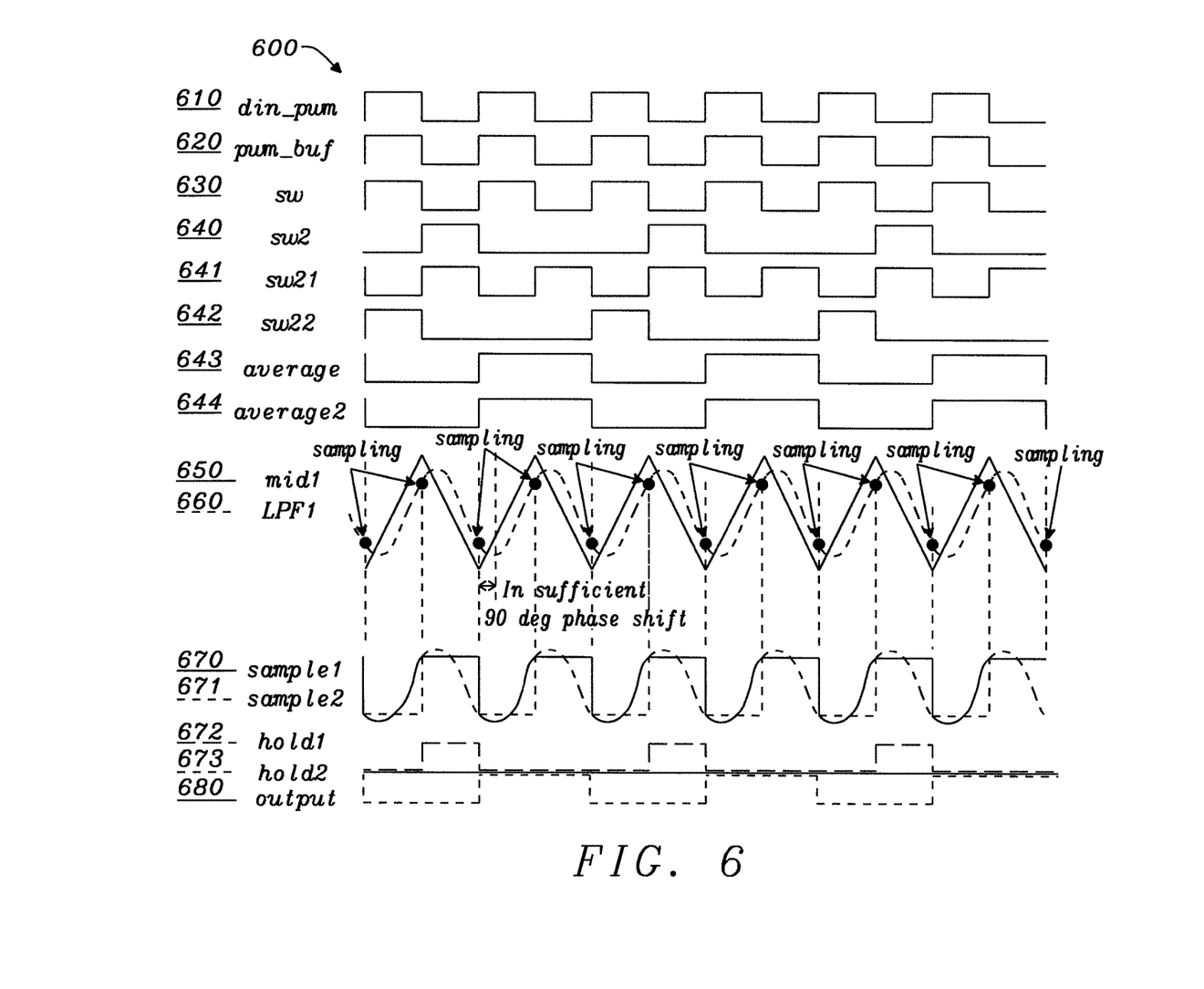
FIG. 6 shows a timing diagram of the schematic illustrated in FIG. 5.

FIG. 6 shows 600, a timing diagram of the schematic illustrated in FIG. 5. Signal din_pwm 610 represents the input to the buffer, and signal pwm_buf 620 the output of the buffer. Node mid1 650 represents the voltage at a first RC filter, at the point where R1 connects to capacitance C1. Node LPF1 660 represents the output voltage of the 2nd order LPF, at the point where R2 connects to capacitance C2. Switch sw 630 is connected between LPF1 and switch sw2 640 at sampling point sample1 670, and switch sw2 is connected between sample1 and hold1 672. Switch average 643 is connected between hold1 and output 680. Switch SW21 641 is connected between LPF1 and sw22 642 at sampling point sample2 671, and switch sw22 is connected between sample2 and hold2 673. Switch average2 644 is connected between hold2 and the output.

The sampling operation occurs both at the rising and falling edges of din_pwm in FIG. 6. There is insufficient 90-degree phase shift between nodes LPF1 and mid1, for this case. Because of the insufficient phase shift, averaging occurs every two cycles of the PWM input signal. Sampling doesn't occur when LPF1 reaches its average voltage. Rather, two points are sampled in a first cycle of the PWM signal, at sample1 and sample2, and averaging is done in a next cycle of the PWM signal, using the average and average2 switches.

The sampling operation occurs both at the rising and falling edges of din_pwm in FIG. 6, when switch sw and sw22 closes, and sw2 and sw21 opens, and again when switch sw and sw22 opens, and sw2 and sw21 closes. Signal hold1 is high and hold2 is low in a first cycle, and averaging is done in a next cycle, when signal hold1 and hold2 are turned off. The average voltage on the output illustrates the removal of the voltage ripple for the circuit of the disclosure.

Figure 7:
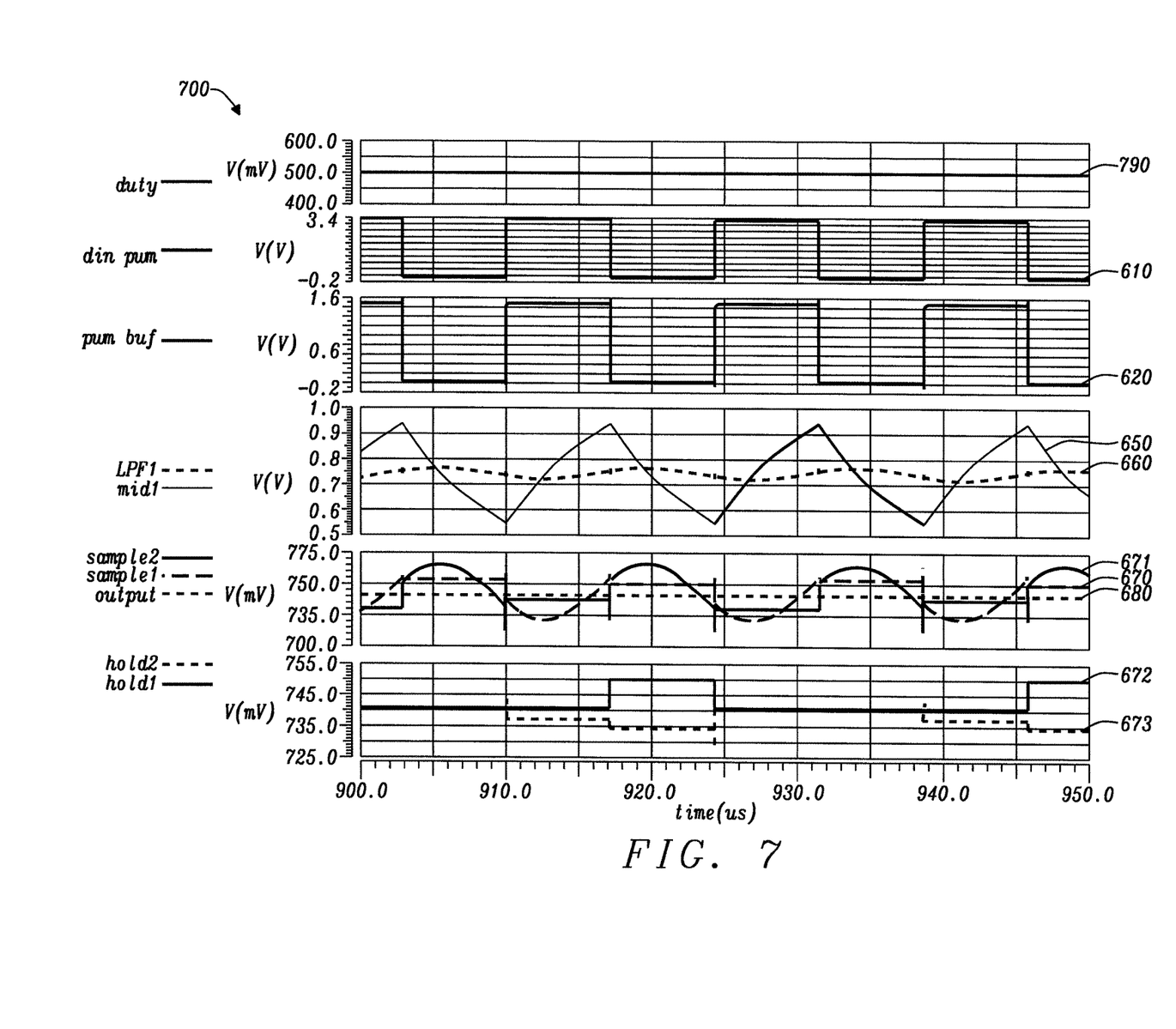
FIG. 7 shows simulation results for the circuit in FIG. 5.

FIG. 7 shows 700, simulation results for the circuit in FIG. 5. The duty cycle is represented by signal 790, and din_pwm 610, pwm_buf 620, mid1 650, LPF1 660, sample1 670, and output 680 are as described in FIG. 6. The sampling operation occurs at both the rising and falling edges of din_pwm, and averaging occurs every two cycles of the PWM signal. Two points are sampled in a first cycle of the PWM signal, at sample1 and sample2 671, and averaging is done in a next cycle. FIG. 7 confirms how the voltage ripple on the output signal is removed, using the switched capacitor circuit of FIG. 5. Note that the order of the LPF may be $2^{nd}$ or higher order, for the circuit of the disclosure.

Other implementations of the disclosure may be constructed with a buffer amplifier between the low pass RC filter, and the switched capacitor (SC) circuit. In addition, an active sample and hold (SAH) circuit may be built around an amplifier, so that the generated output voltage is relatively low-impedance in nature.

Figure 8A:
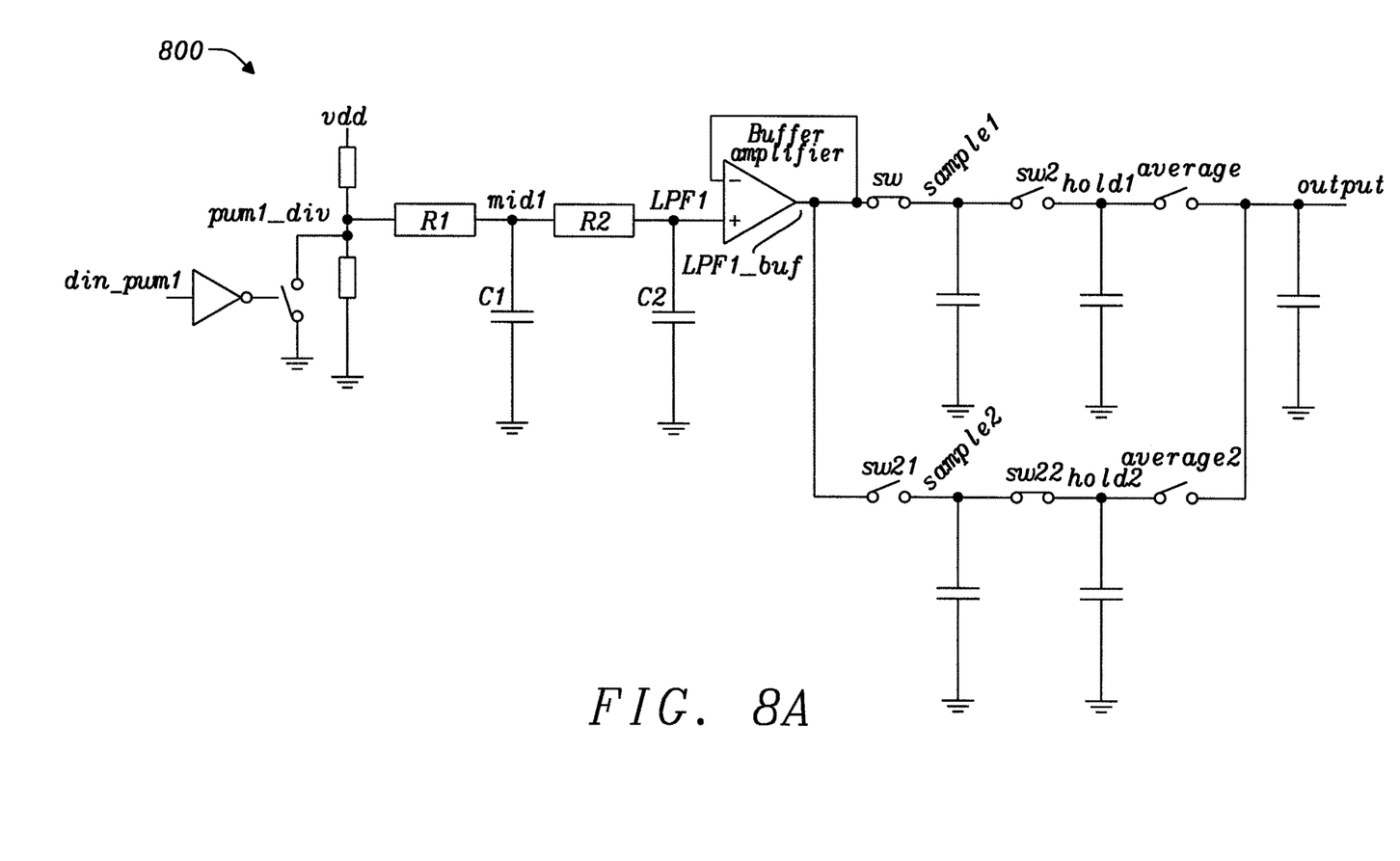
FIG. 8A shows 800, a buffer amplifier between the low pass RC filter, and the switched capacitor (SC) circuit, of the present disclosure.

FIG. 8A shows 800, a buffer amplifier between the low pass RC filter, and the switched capacitor (SC) circuit, of the present disclosure. This circuit has two sampling paths, sample1 and sample2, to average the output voltage from, for a given sampling operation. The circuit consists of a 2nd order low pass filter (LPF), a buffer, and two switched capacitor circuits connected in parallel with one another. The sampling operation may occur at both the rising and falling edges of the PWM signal, similar to FIG. 6. What differs in the implementation of FIG. 8A is that the buffer is now connected between the low pass RC filter and switched capacitor circuits. The purpose of the buffer is to separate the SC circuit from the RC filter, to prevent the propagation of noise to input signal LPF1, from the SC circuit.

Figure 8B:
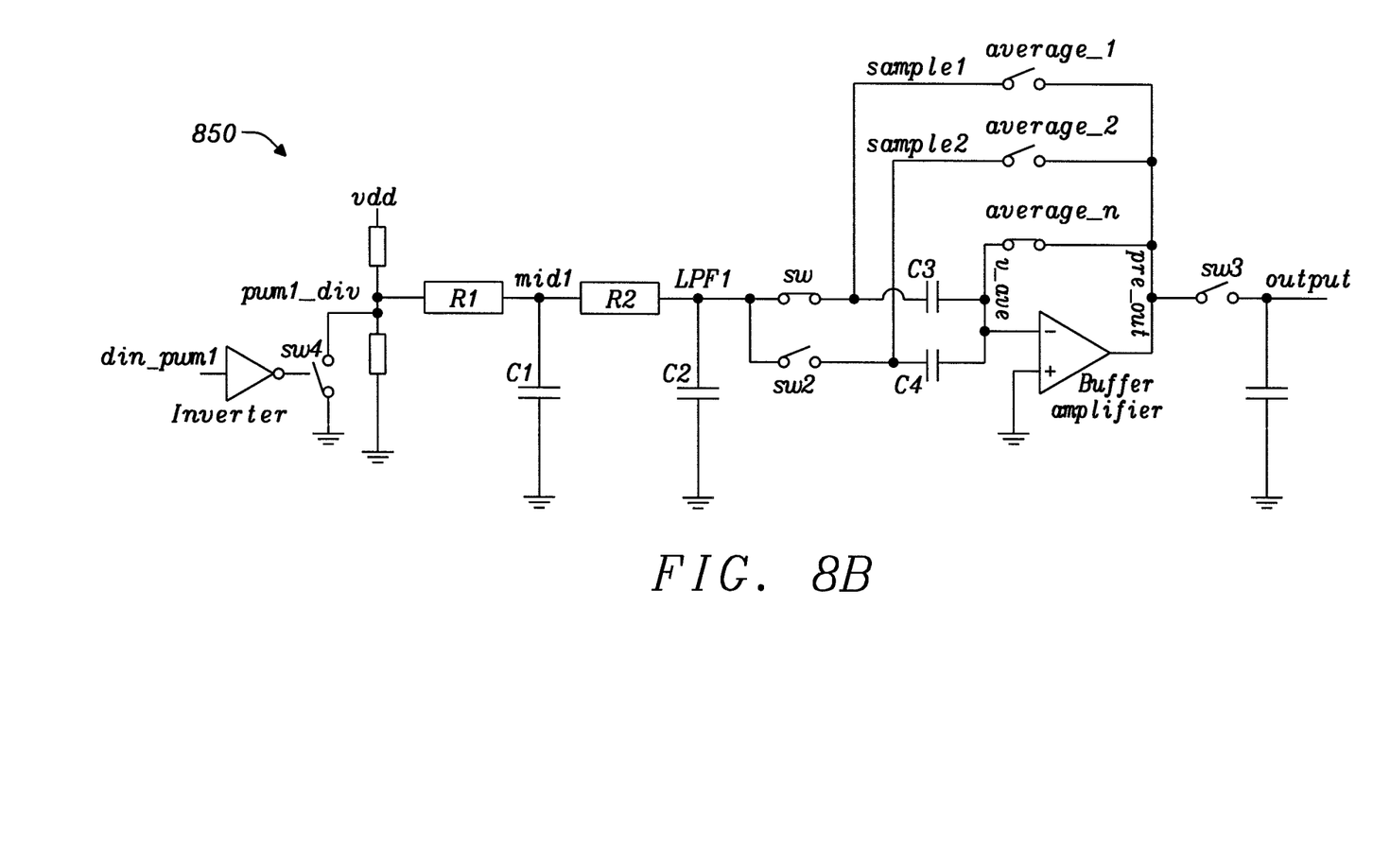
FIG. 8B shows 850, an active sample and hold (SAH) circuit built around the amplifier, of the present disclosure.

FIG. 8B shows 850, an active sample and hold (SAH) circuit built around the amplifier, of the present disclosure. This circuit has two sampling paths, sample1 and sample2, to average the output voltage from, for a given sampling operation. The circuit consists of a 2nd order low pass filter (LPF), two switched capacitor circuits connected in parallel with one another, and a buffer amplifier now connected in parallel to the sampling paths. The sampling operation may occur at both the rising and falling edges of the PWM signal, similar to FIG. 6. What differs in the implementation of FIG. 8B is that an active SAH circuit is built around the buffer amplifier, where an average voltage v_ave (of average_1 and average_2) is input to an inverting input of the buffer amplifier, and a reference voltage 881 (ground) is input to a non-inverting input of the buffer amplifier. Switch average_n 856 is connected across v_ave and buffer amplifier output pre_out 879. Switch sw3 857 is connected between pre_out and output 880. Switch sw4 is connected between pwm1_div and ground.

Figure 8C:
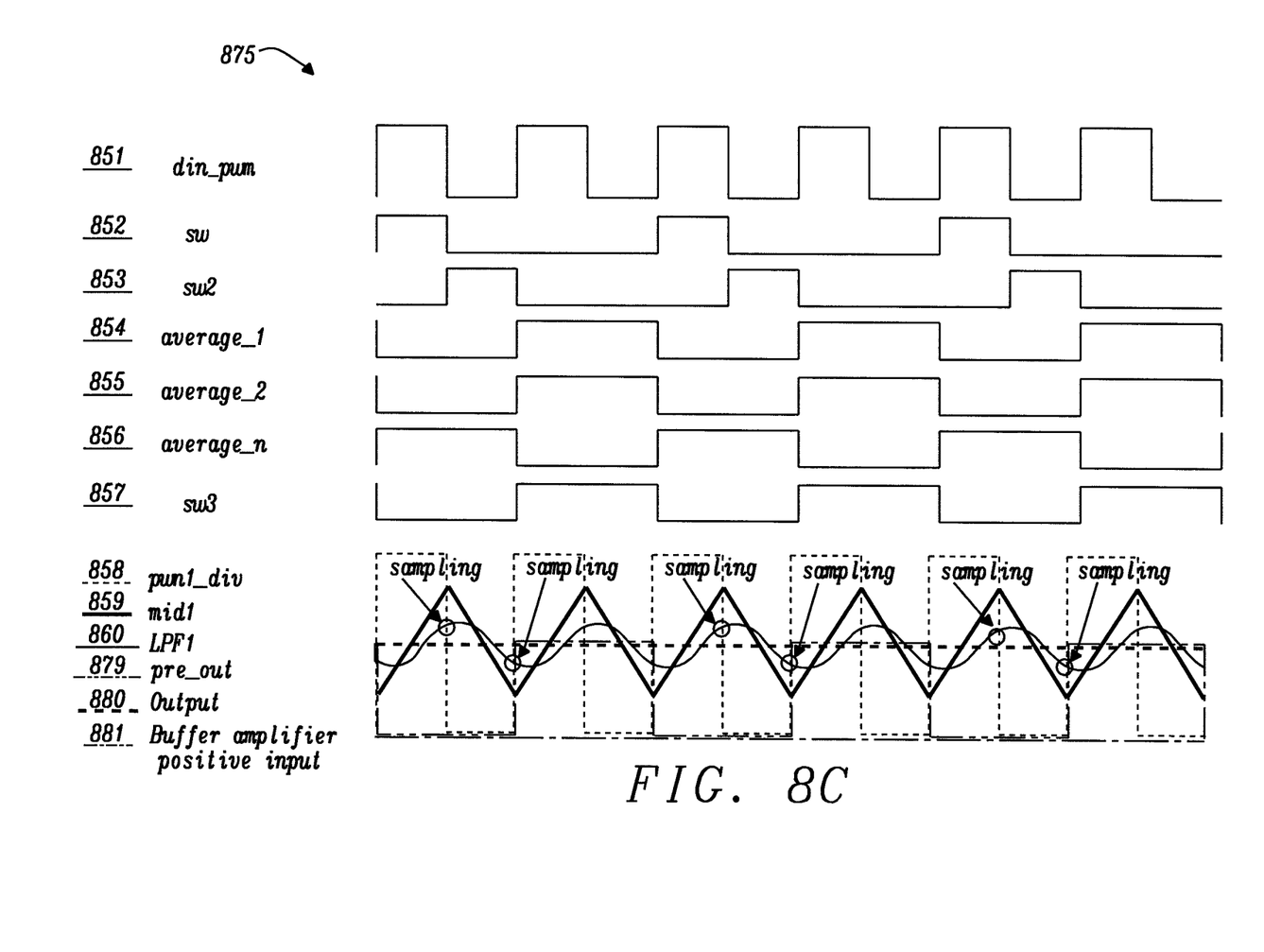
FIG. 8C shows a timing diagram for the active sample and hold (SAH) circuit built around the amplifier of FIG. 8B.

FIG. 8C shows 875, a timing diagram for the active sample and hold (SAH) circuit built around the amplifier of FIG. 8B. Signal din_pwm 851 represents the input to the inverter, and pwm1_div 858 is input to a first RC filter. Node mid1 859 represents the voltage at the first RC filter, at the point where R1 connects to capacitance C1. Node LPF1 860 represents the output voltage of the 2nd order LPF, at the point where R2 connects to capacitance C2. Switch sw 852 is connected between LPF1 and capacitance C3, and switch sw2 853 is connected between LPF1 and capacitance C4. Switch average_1 854 is connected between sw and pre_out. Switch average_2 855 is connected between sw2 and pre_out. The sampling operation occurs both at the rising and falling edges of din_pwm in FIG. 8C, when switch sw closes and sw2 opens, and again when switch sw opens and sw2 closes.

Figure 8D:
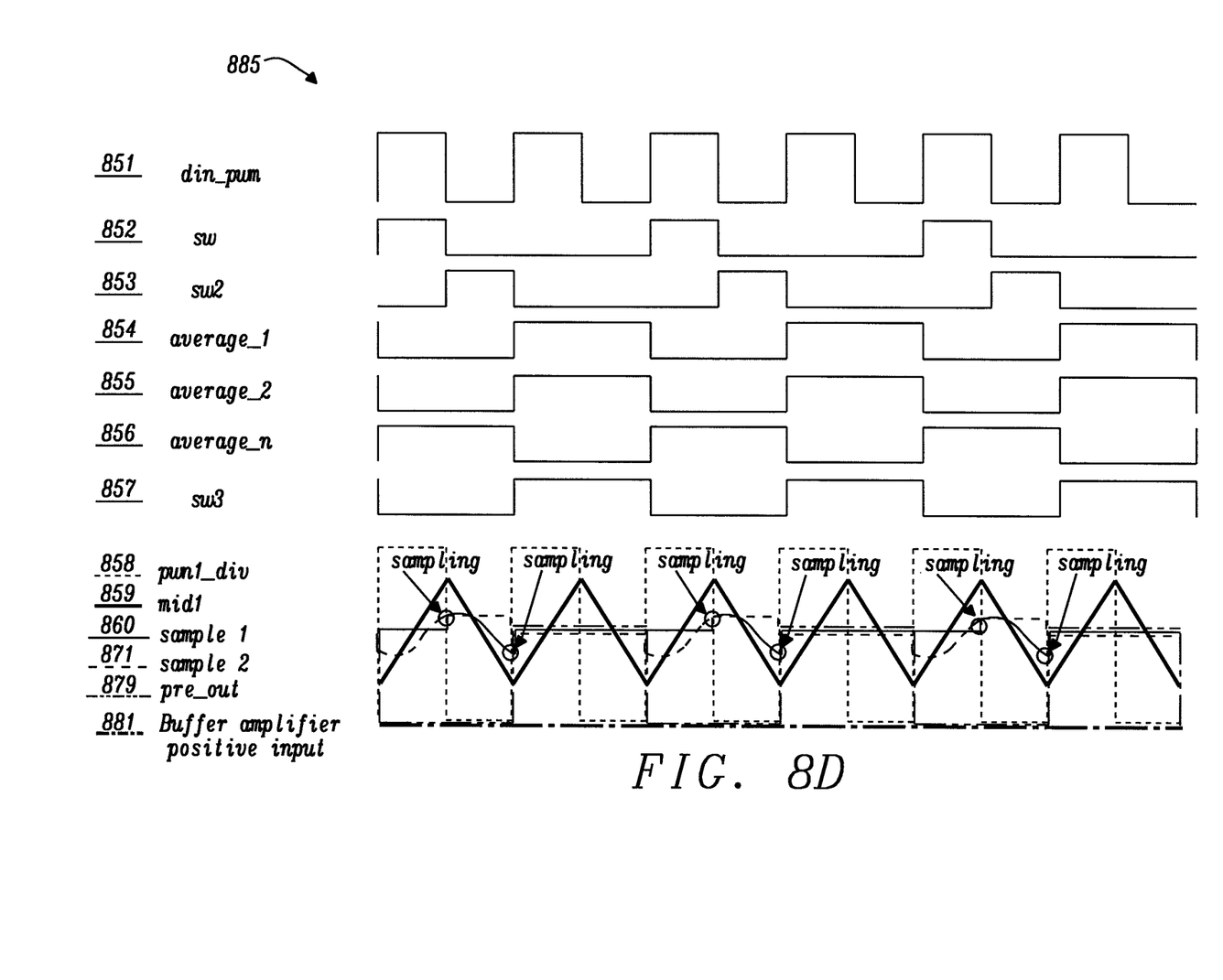
FIG. 8D shows an additional timing diagram for the active sample and hold (SAH) circuit built around the amplifier of FIG. 8B.

FIG. 8D shows 885, an additional timing diagram for the active sample and hold (SAH) circuit built around the amplifier of FIG. 8B. Switch sw 852 is connected between LPF1 and capacitance C3 at sampling point sample1 870, and switch sw2 853 is connected between LPF1 and capacitance C4 at sampling point sample2 871. The curved portions of signals sample1 and sample2 in FIG. 8D follow the curved portions of signal LPF1 in FIG. 8C.

Figure 9:
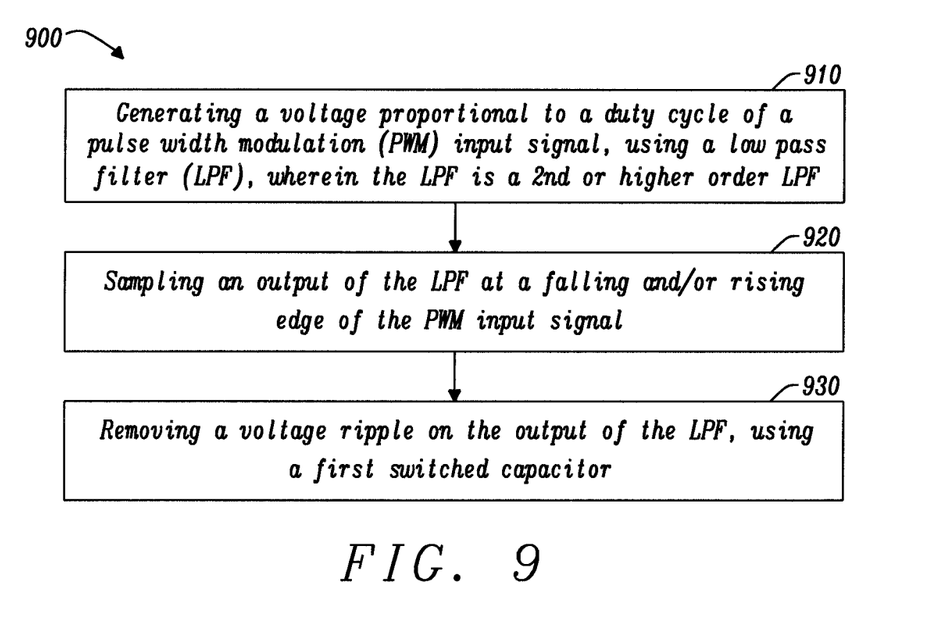
FIG. 9 is a flow chart of a method for generating a pulse width modulation (PWM) controlled analog signal.

FIG. 9 is flow chart 900, of a method for generating a pulse width modulation (PWM) controlled analog signal. The steps include 910, generating a voltage proportional to a duty cycle of a pulse width modulation (PWM) input signal, using a low pass filter (LPF), where the LPF is a $2^{nd}$ or higher order LPF. The steps include 920, sampling an output of the LPF at a falling and/or rising edge of the PWM input signal. The steps also include 930, removing a voltage ripple on the output of the LPF, using a first switched capacitor circuit.

The main advantage of one or more embodiments of the present disclosure include the settling of the output to a 'flat' voltage, as compared to the response of a low pass filter (LPF) of the prior art, that would give a higher voltage ripple on the LPF output. Note that the circuit design of the disclosure needs to be optimum, in terms of its resistor-capacitor (RC) values versus its switched capacitor (SC) values, in order to get a reasonably linear response without suffering from component variation.

While particular embodiments of the present disclosure have been illustrated and described, it will be understood by those skilled in the art that various changes in form and details may be made without departing from the spirit and scope of the invention.

What is claimed is:

1. A circuit for generating a pulse width modulation (PWM) controlled analog signal, comprising:
    a buffer, configured to receive a PWM input signal;
    a low pass filter (LPF), connected to a buffer output, configured to remove a voltage ripple on an LPF output, the LPF comprising:
        a 2nd or higher order LPF; and
    a first switched capacitor (SC) circuit, connected to the LPF output, configured to remove a remaining voltage ripple, and to output the PWM controlled analog signal, wherein
    a first sampling operation is configured at a falling edge of the PWM input signal, when a first switch is configured to open and a second switch is configured to close.

2. The circuit of claim 1, further comprising a first switch connected between the LPF output and a second switch, for the first sampling operation.

3. The circuit of claim 1, configured so that the LPF output has a phase shift of 90×(2n+1) degrees for (n=0, 1, 2, . . . ), compared to a signal at a first order of the LPF.

4. The circuit of claim 2, wherein the first sampling operation is configured to occur at a rising edge of the PWM signal.

5. The circuit of claim 2, further comprising a $2^{nd}$ switched capacitor circuit, connected in parallel with the $1^{st}$ switched capacitor circuit.

6. The circuit of claim 5, wherein said $2^{nd}$ switched capacitor circuit comprises a third switch connected between the LPF output and a fourth switch, for a second sampling operation.

7. The circuit of claim 6, wherein the second sampling operation is configured to occur at both a rising and a falling edge of the PWM input signal.

8. The circuit of claim 6, wherein the second sampling operation further comprises two points sampled in a first cycle of the PWM input signal, and averaged in a next cycle of the PWM input signal.

9. The circuit of claim 1, further comprising a buffer amplifier connected between the low pass filter, (LPF) and the switched capacitor (SC) circuit.

10. The circuit of claim 1, wherein said first SC circuit comprises a sample and hold (SAH) circuit built around an amplifier.

11. A method for generating a pulse width modulation (PWM) controlled analog signal, comprising:
    generating a voltage proportional to a duty cycle of a pulse width modulation (PWM) input signal, using a low pass filter (LPF),
    wherein the LPF is a $2^{nd}$ or higher order LPF;
    sampling an output of the LPF at a falling and/or rising edge of the PWM input signal, when a first switch is configured to open and a second switch is configured to close;
    and
    removing a voltage ripple on the output of the LPF, using a first switched capacitor circuit.

12. The method of claim 11, comprising the first sampling operation, further comprising a first switch connected between the output of the LPF and a second switch.

13. The method of claim 11, configured so that the output of the LPF has a phase shift of $90\times(2n+1)$ degrees for ($n=0, 1, 2, \ldots$), compared to a signal at a first order of the LPF.

14. The method of claim 12, wherein the first sampling operation occurs at a rising edge of the PWM signal.

15. The method of claim 12, further comprising a $2^{nd}$ switched capacitor circuit, connected in parallel with the $1^{st}$ switched capacitor circuit.

16. The method of claim 15, further comprising a third switch connected between the output of the LPF and a fourth switch, for a second sampling operation.

17. The method of claim 16, wherein the second sampling operation occurs at both a falling and a rising edge of the PWM input signal.

18. The method of claim 16, wherein the second sampling operation further comprises two points sampled in a first cycle of the PWM input signal, and averaged in a next cycle of the PWM input signal.

19. The method of claim 11, further comprising a buffer amplifier connected between the low pass filter, (LPF) and the switched capacitor (SC) circuit.

20. The method of claim 11, wherein said first SC circuit comprises a sample and hold (SAH) circuit built around an amplifier.

\* \* \* \* \*